(12) United States Patent
Liu et al.

(10) Patent No.: US 11,644,757 B2
(45) Date of Patent: May 9, 2023

(54) METHOD TO ACHIEVE TILTED PATTERNING WITH A THROUGH RESIST THICKNESS USING PROJECTION OPTICS

(71) Applicant: Intel Corporation, Santa Clara, CA (US)

(72) Inventors: Changhua Liu, Chandler, AZ (US); Jianyong Mo, Chandler, AZ (US); Liang Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 596 days.

(21) Appl. No.: 16/721,786

(22) Filed: Dec. 19, 2019

(65) Prior Publication Data

US 2021/0191282 A1     Jun. 24, 2021

(51) Int. Cl.
*G03F 7/20*     (2006.01)
*B81B 1/00*     (2006.01)
*B81C 1/00*     (2006.01)

(52) U.S. Cl.
CPC ............ *G03F 7/70733* (2013.01); *B81B 1/00* (2013.01); *B81C 1/00111* (2013.01); *G03F 7/201* (2013.01); *B81B 2203/0361* (2013.01); *B81C 2201/0159* (2013.01)

(58) Field of Classification Search
CPC .. G03F 7/70733; G03F 7/201; G03F 7/70258; G03F 7/70225; G03F 7/70275; G03F 7/70241; B81B 1/00; B81B 2203/0361; B81C 1/00111; B81C 2201/0159; G02B 13/22

See application file for complete search history.

(56) References Cited

U.S. PATENT DOCUMENTS

| | | | |
|---|---|---|---|
| 5,272,501 A * | 12/1993 | Nishi | .................... G03F 9/7049 355/71 |
| 2006/0146304 A1 | 7/2006 | Schwab | |
| 2007/0003839 A1* | 1/2007 | Rabarot | ............. B81C 1/00103 430/311 |
| 2009/0162798 A1* | 6/2009 | Tomono | .................. G03F 7/201 428/156 |

(Continued)

OTHER PUBLICATIONS

Search Report from European Patent Application No. 20193120.1, dated Feb. 19, 2021, 9 pgs.

(Continued)

*Primary Examiner* — Yasser A Abdelaziez
(74) *Attorney, Agent, or Firm* — Schwabe, Williamson & Wyatt, P.C.

(57) ABSTRACT

Embodiments disclosed herein include lithographic patterning systems for non-orthogonal patterning and devices formed with such patterning. In an embodiment, a lithographic patterning system comprises an actinic radiation source, where the actinic radiation source is configured to propagate light along an optical axis. In an embodiment, the lithographic patterning system further comprises a mask mount, where the mask mount is configurable to orient a surface of a mask at a first angle with respect to the optical axis. In an embodiment, the lithographic patterning system further comprises a lens module, and a substrate mount, where the substrate mount is configurable to orient a surface of a substrate at a second angle with respect to the optical axis.

17 Claims, 10 Drawing Sheets

(56) References Cited

U.S. PATENT DOCUMENTS

2010/0195082 A1* 8/2010 Yoon .................. G03F 7/201
355/72
2017/0285493 A1 10/2017 Andre

OTHER PUBLICATIONS

Harburg Daniel V et al: "On-chip RF power inductors with nanogranular magnetic cores using prism-assisted UV-LED lithography", 2013 Transducers & Eurosensors XXVII: The 17th International Conference on Solid-State Sensors, Actuators and Microsystems (Transducers & Eurosensors XXVII), IEEE, Jun. 16, 2013 (Jun. 16, 2013), pp. 701-704, XP032499280, DOI: 10.1109/TRANSDUCERS.2013.6626863 [retrieved on Oct. 9, 2013].

* cited by examiner

METHOD TO ACHIEVE TILTED PATTERNING WITH A THROUGH RESIST THICKNESS USING PROJECTION OPTICS

TECHNICAL FIELD

Embodiments of the present disclosure relate to semiconductor devices, and more particularly to projection optics systems to provide tilted patterning.

BACKGROUND

Traditional photolithography assumes a vertical projection of the actinic radiation used to expose a resist layer. As such, the exposure image field is projected into the resist vertically and the resulting features patterned into the resist layer will stand substantially perpendicular to the surface of the resist layer. Devices (e.g., transistor devices, packaging layers, micro-electromechanical systems (MEMS), and the like) designed or fabricated with such vertical projection lithography will have horizontal lines and perpendicular vias.

In some applications, angled structures are desired. For example, MEMS devices may utilize angled structures or pins. Currently, angled patterning is implemented by angling the substrate relative to the path of the actinic radiation. However, such configurations are not currently able to provide high resolution across the surface of the image plane. This is because the substrate has a non-uniform distance from the focusing lens. As such, the image plane does not land on the substrate at all locations, and a portion of the image is blurred. Such limitations limit the aspect ratio of the resulting pins.

EMBODIMENTS OF THE PRESENT DISCLOSURE

Described herein are electronic packages with tilted structures that are patterned with projection optics, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
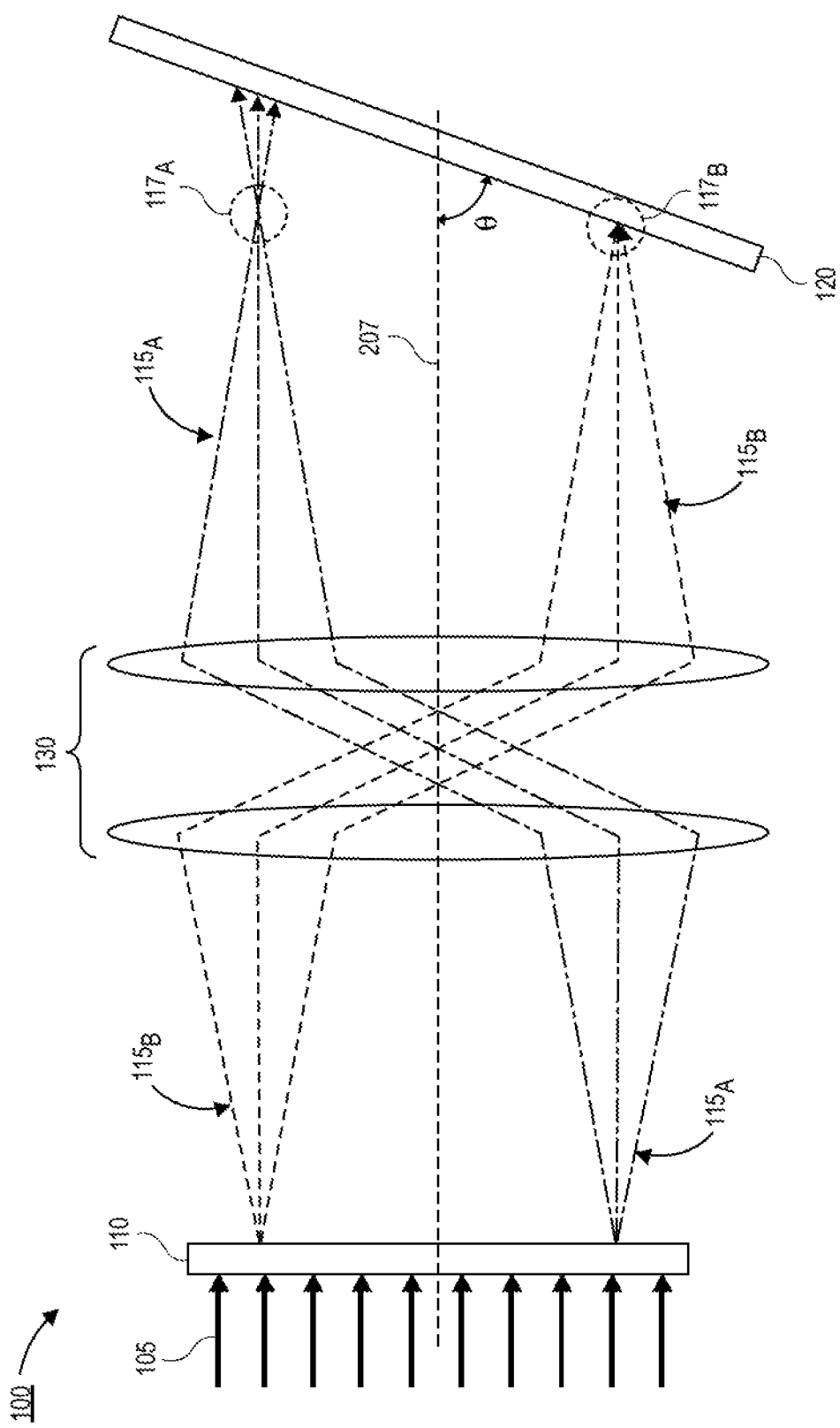
FIG. 1 is a cross-sectional illustration of an imaging system with a tilted substrate.

As noted above, current solutions for providing tilted patterning suffer from low resolution and a limited aspect ratio. An example of one such actinic imaging system 100 is shown in FIG. 1. As shown, a light source propagates light 105 through a reticle 110 (also referred to sometimes as a mask). For simplicity light $115_A$ and $115_B$ that passes through a bottom opening and a top opening, respectively, is shown. The light $115_A$ and $115_B$ passes through a lens module 130 and towards a substrate 120. The substrate 120 is oriented at an angle θ relative to the optical axis 207. Due to the angle of the substrate 120, the focal point 117A does not land on the surface of the substrate 120, while the focal point $117_B$ does land on the surface of the substrate 120. Accordingly, at least some portion of the projected image onto the substrate is out of focus.

Therefore, embodiments disclosed herein provide an actinic imaging system that enables high resolution angled patterning. For example, embodiments disclosed herein allow for aspect ratios of approximately 30:1 or greater. Particularly, some embodiments disclosed herein utilize a Scheimpflug layout and a bi-telecentric lens. That is, the object plane (e.g., the reticle) and the image plane are both tilted. Using such a layout allows for the image plane to fall entirely on a tilted substrate. Furthermore, the bi-telecentric lens ensures that the image's principle rays stay parallel to the optical axis, and the afocal nature of the bi-telecentric lens ensures that the magnification of the resulting image is constant with no distortion. In some embodiments, a prism may also be added over the substrate to overcome the angle reduction inside the resist due to light bending at the air-resist interface. This enables a wider range of useable tilt angles inside the photoresist.

Figure 2A:
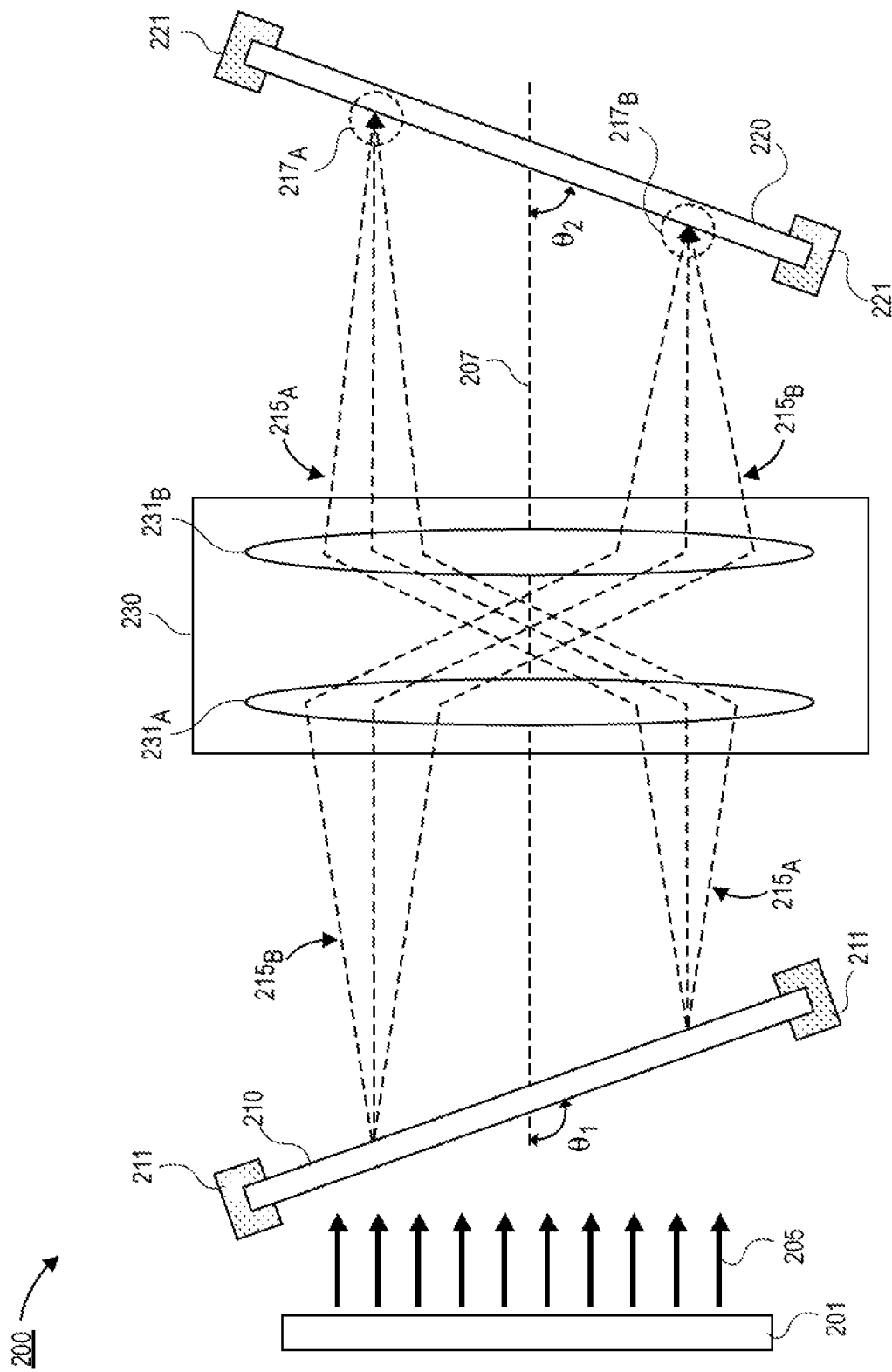
FIG. 2A is a cross-sectional illustration of an imaging system with a tilted reticle and a tilted substrate, in accordance with an embodiment.

Referring now to FIG. 2A, a cross-sectional illustration of an actinic imaging system 200 is shown, in accordance with an embodiment. In an embodiment, the imaging system 200 comprises an actinic light source 201. The actinic light source 201 may emit electromagnetic radiation 205 (also simply referred to herein as light 205) that initiates a chemical reaction in a resist layer on the substrate 220. The resist layer may subsequently be developed (i.e., removal of the reacted portions or the unreacted portions, depending on the tone of the resist) with a developing solution. For example, the actinic light source 201 may be an ultraviolet (UV) light source, or a deep ultraviolet (DUV) or an extreme ultraviolet (EUV) light source.

In an embodiment, the light 205 is propagated towards and through a reticle 210. The reticle 210 may be secured by a mount 211. The mount 211 may be adjustable to orient the reticle 210 at a first angle $\theta_1$ relative to an optical axis 207 that passes through the imaging system 200. While the mount 211 is shown as securing opposing edges of the reticle 210, it is to be appreciated that any suitable mount may be used. The reticle 210 may block portions of the light 205. Portions of the light 205 that pass through the reticle 210 are referenced as light 215. For simplicity light 205 passing through two openings are shown (i.e., at the top of the reticle 210 and at the bottom of the reticle 210). Light $215_A$ propagates through the bottom opening and light $215_B$ propagates through the top opening.

In an embodiment, the light $215_A$ and $215_B$ propagates through a lens module 230. The lens module 230 may comprise one or more lenses 231. For example, a first lens $231_A$ and a second lens $231_B$ are shown. In an embodiment, the lenses 231 may be bi-telecentric lenses. Telecentric lenses eliminate the parallax error characteristic of standard lenses by having a constant, non-angular field of view. That is, at any distance from the lens, a telecentric lens will always have the same field of view. Particularly, the chief ray (i.e., the middle ray in each illustrated group of rays 215) maintains a parallel relationship with the optical axis 207. As such, there is no magnification error at the image plane.

In an embodiment, the imaging system further comprises a substrate 220. The substrate 220 may be secured by a mount 221. The mount 221 is adjustable to orient the substrate 220 at a second angle $\theta_2$ with respect to the optical axis 207. While the mount 221 is shown as securing opposing edges of the substrate 220, it is to be appreciated that any suitable mount may be used. In an embodiment, the first angle $\theta_1$ and the second angle $\theta_2$ are different angles. For example, the reticle 210 may have a negative tilt (i.e., the top edge of the reticle 210 is tilted towards the source 201) and the substrate 220 may have a positive tilt (i.e., the top edge of the substrate 220 is tilted away from the source 201). In some embodiments, the first angle $\theta_1$ and the second angle $\theta_2$ are supplementary angles. That is, the sum of the first angle $\theta_1$ and the second angle $\theta_2$ is approximately 180°.

In an embodiment, the image plane of the imaging system 200 falls substantially on the tilted surface of the substrate 220. That is, the focal points $217_A$ and $217_B$ land on the surface of the substrate 220. Accordingly, the entire image projected onto the surface of the substrate 220 is in focus despite the angled orientation of the substrate 220. As such, a high resolution angled pattern may be provided on the substrate 220.

In FIG. 2A, the substrate 220 is shown as a single monolithic block. However, it is to be appreciated that the substrate 220 may comprise any number of layers. For example, the substrate 220 may comprise organic packaging layers, conductive traces, vias, pads, and the like. In a particular embodiment, the substrate 220 may further comprise a photoresist layer over the surface of the substrate 220 facing the source 201. The image plane (i.e., the focal points 217) may be positioned over a surface of the photoresist layer, within the photoresist layer, or at the surface of the substrate 220 below the photoresist layer.

Figure 2B:
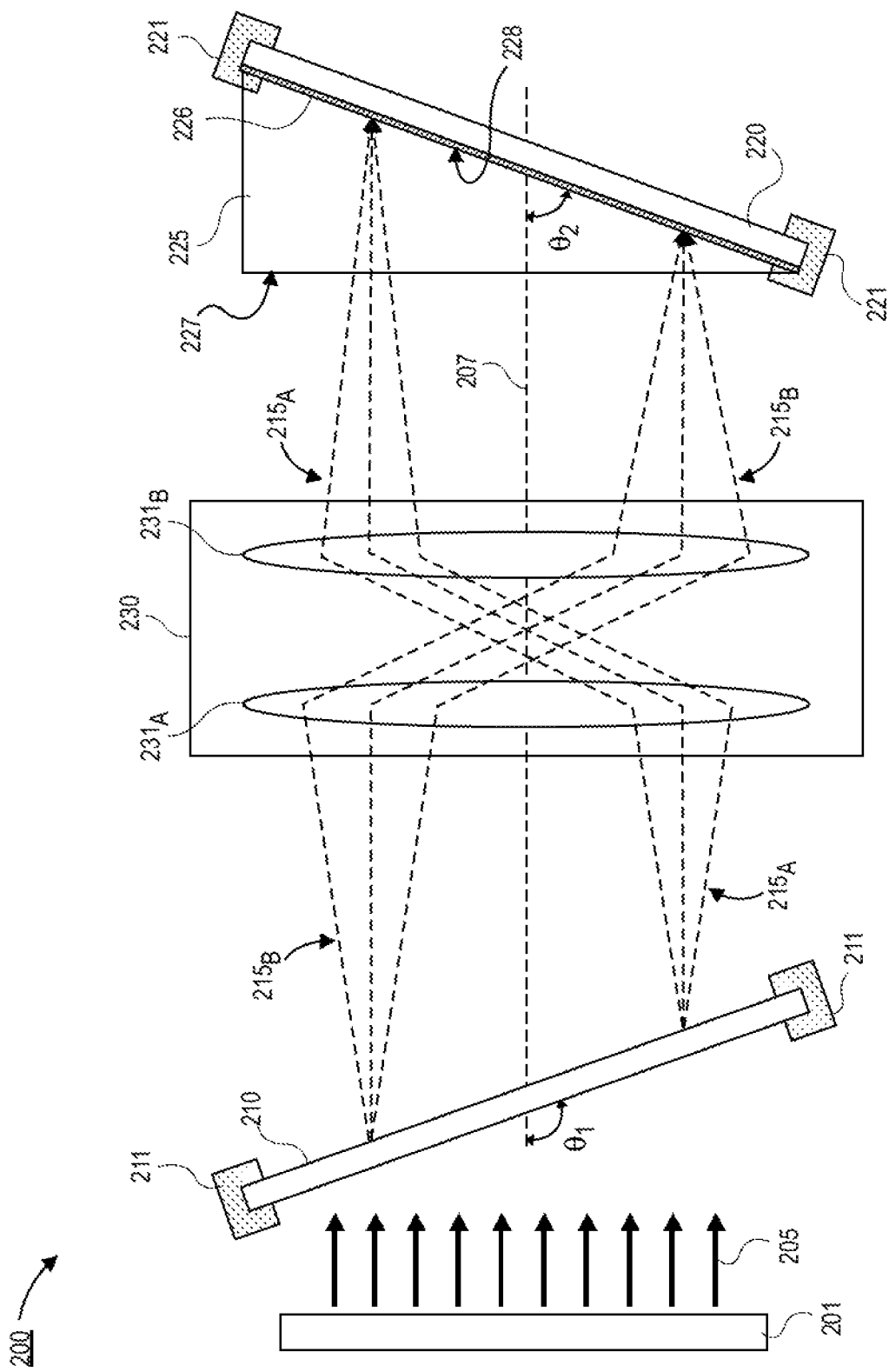
FIG. 2B is a cross-sectional illustration of an actinic imaging system with a tilted reticle, a tilted substrate, and a prism over the substrate, in accordance with an embodiment.

Referring now to FIG. 2B, a cross-sectional illustration of an optical system 200 is shown, in accordance with an additional embodiment. In an embodiment, the optical system 200 may be substantially similar to the optical system 200 in FIG. 2A, with the exception that a prism 225 is disposed over the substrate 220. In an embodiment, the prism 225 may include a surface 227 that is oriented substantially perpendicular to the optical axis 207 and a surface 228 that is substantially parallel to the surface of the substrate 220. In an embodiment, the light $215_A$ and $215_B$ may propagate through the prism 225 before reaching the substrate 220. In some embodiments, an interface layer 226 may further be positioned between the prism 225 and the substrate 220.

As the second angle $\theta_2$ deceases, the angle of the patterned features becomes more severe relative to the surface of the substrate 220. However, at a certain angle (dependent on the index of refraction of the photoresist and polarization of the light), the light will substantially reflect off of the surface and not enter the photoresist. Accordingly, the presence of the prism 225 (and the optional interface layer 226) may serve as a buffer layer that allows for further reductions in the second angle $\theta_2$. In an embodiment, the buffering may be obtained by choosing a material for the prism 225 (and the optional interface layer 226) that has an index of refraction between that of air and the photoresist.

Figure 3A:
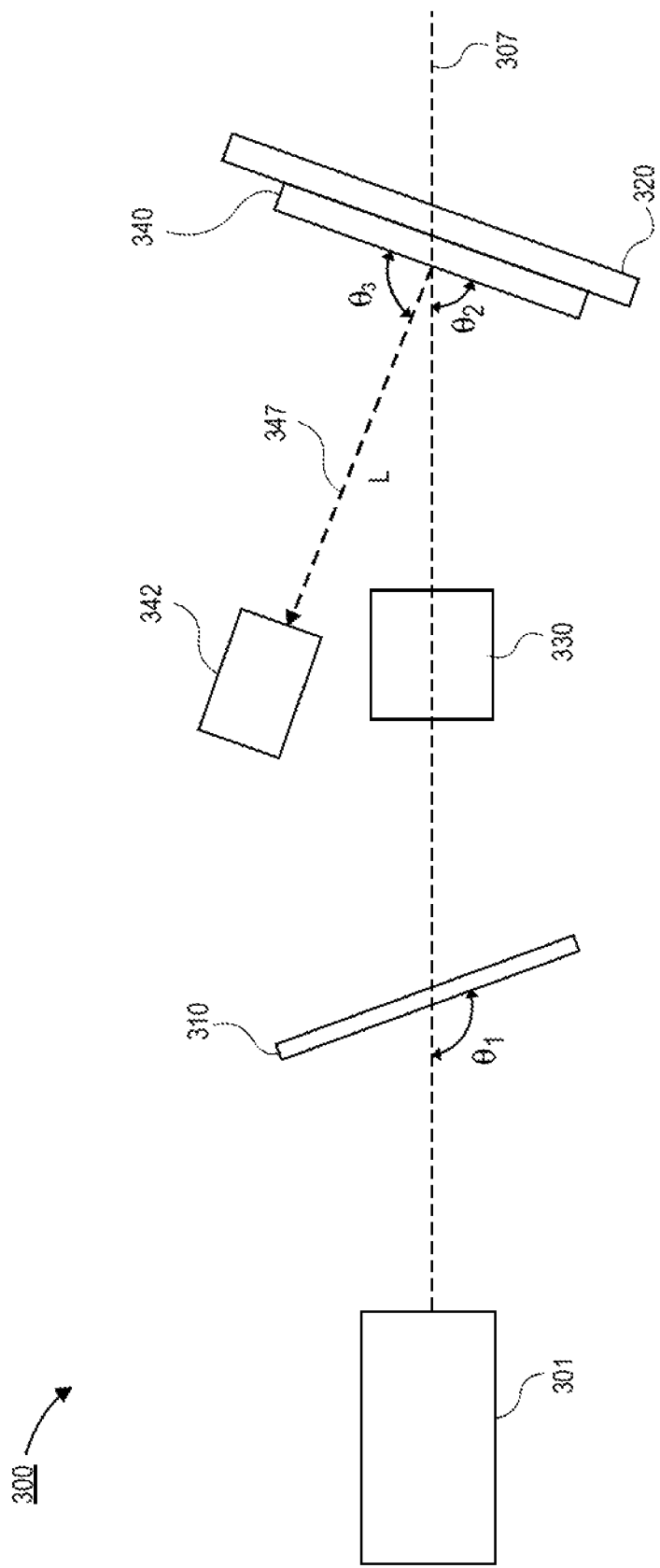
FIG. 3A is a cross-sectional illustration of an imaging system with an alignment camera and an image capture camera on the substrate, in accordance with an embodiment.
Figure 3B:
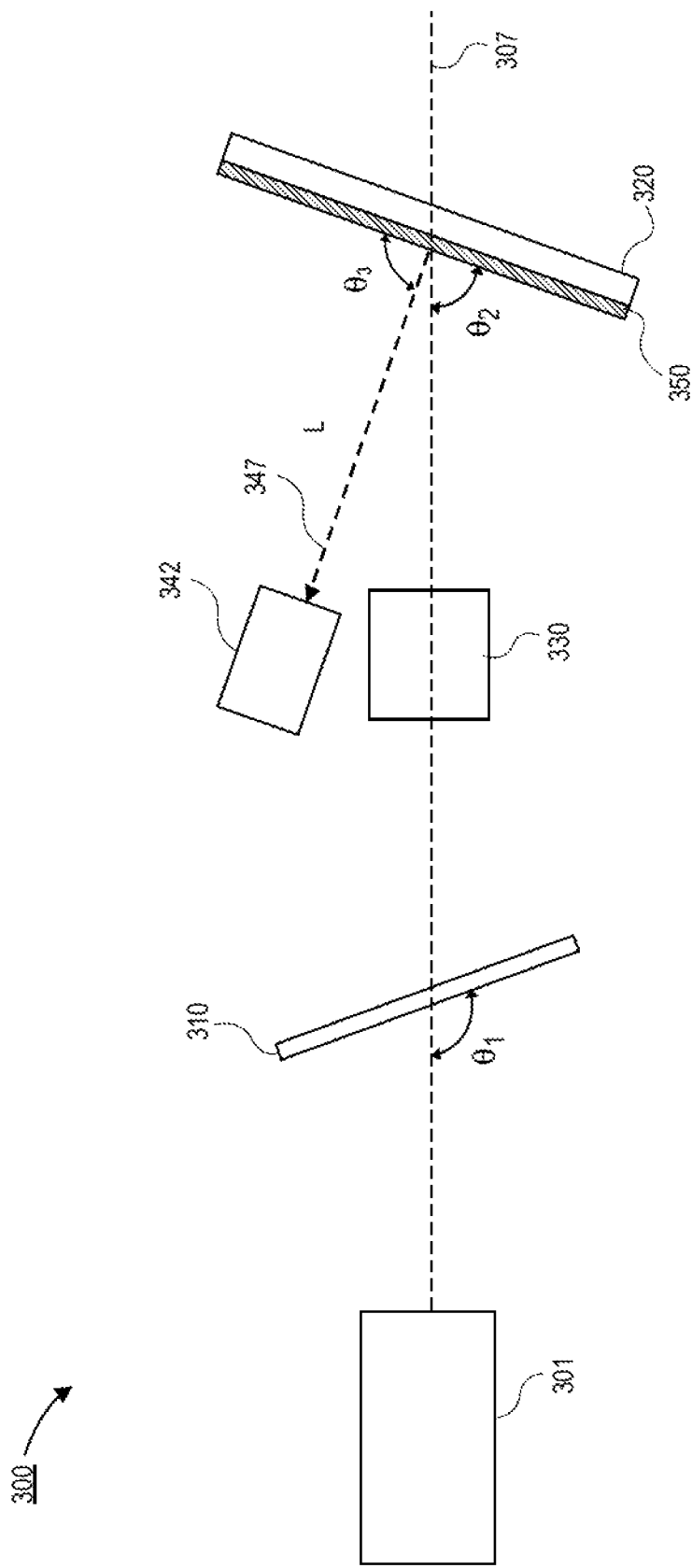
FIG. 3B is a cross-sectional illustration of an imaging system with an alignment camera and a photoresist layer over the substrate, in accordance with an embodiment.

Referring now to FIGS. 3A and 3B, a pair of cross-sectional illustrations of an imaging system 300 are shown, in accordance with an embodiment. In an embodiment, the imaging system 300 allows for highly accurate alignment of the substrate 320 so that the entire surface is in focus.

Referring now to FIG. 3A, a cross-sectional illustration of an imaging system 300 is shown, in accordance with an embodiment. The imaging system 300 may comprise a source 301, a reticle 310, a lens module 330, and a substrate 320. The reticle 310 may be oriented at a first angle $\theta_1$ relative to the optical axis 307 and the substrate 320 may be oriented at second angle $\theta_2$ relative to the optical axis 307.

In an embodiment, a sensor 340 is disposed over the substrate 320. In some embodiments, the substrate 320 may be absent with only the sensor 340 mounted in the imaging system 300 (e.g., with a mount (not shown)). In an embodiment, the sensor 340 may be a camera or a portion of a camera. For example, the sensor 340 may comprise a charge coupled device (CCD) or the like. Light (not shown) from the source 301 is propagated through the imaging system 300 and intersects with the sensor 340. The output of the sensor 340 may be examiner to determine if the entire sensor surface is in focus. If the entire sensor is not in focus, then adjustments to the second angle $\theta_2$ and/or the distance between the sensor 340 and the lens module 330 may be made.

In an embodiment, the imaging system 300 may also include a second sensor 342. In an embodiment, the second sensor 342 may also comprise a CCD. The second sensor 342 is used to accurately determine the position and tilt of the image plane. After the first sensor 340 is properly aligned and the image is entirely in focus, it is known that the image plane and the first sensor 340 are coincident. As such, measuring the tilt and position of the first sensor 340 also provides the tilt and position information of the image plane.

In an embodiment, the second sensor 342 may measure the tilt and the position of the first sensor 340 by detecting light 347 reflected off of the surface of the first sensor 340. By detecting the position the reflected light hits the second sensor 342 (e.g., the position of the pixels of a CCD that detect the reflected light), the distance L between the image plane and the second sensor 342 and the second angle $\theta_2$ may be calculated. In an embodiment, a third angle $\theta_3$ may be approximately 90°. That is, the optical axis of the second sensor 342 may be substantially perpendicular to the sensor 340. In some embodiments, the second sensor 342 may further comprise an autocollimator to further improve the accuracy of the surface tilt measurement. That is, a camera portion of the second sensor 342 may provide a distance L alignment, and the autocollimator portion of the second sensor 342 may provide a tilt measurement of the sensor 340.

Referring now to FIG. 3B, a cross-sectional illustration of the imaging system 300 after the first sensor 340 is replaced with a photoresist layer 350 over a substrate 320 is shown, in accordance with an embodiment. Since the first sensor is removed, the alignment of the photoresist 350 is determined by using the second sensor 342. For example, the photoresist 350 will be coincident with the image plane once light 347 reflecting off of the photoresist 350 is focused on the same pixel (or pixels) of the second sensor 342 that were exposed when the first sensor 340 was measured. Accordingly, highly accurate tilt and positioning of the photoresist can be used to provide high resolution patterning.

Referring now to FIGS. 4A-4D, a series of cross-sectional illustrations of a workpiece 460 that is patterned with an imaging system such as those described herein is shown, in accordance with an embodiment. In an embodiment, the workpiece 460 may be any device that includes features that are oriented at a non-orthogonal angle with respect to a main surface (i.e., the planar surface) of the substrate. In a particular embodiment, the workpiece 460 is a part of a MEMS device. The angled features may include conductive pins or posts.

Figure 4A:
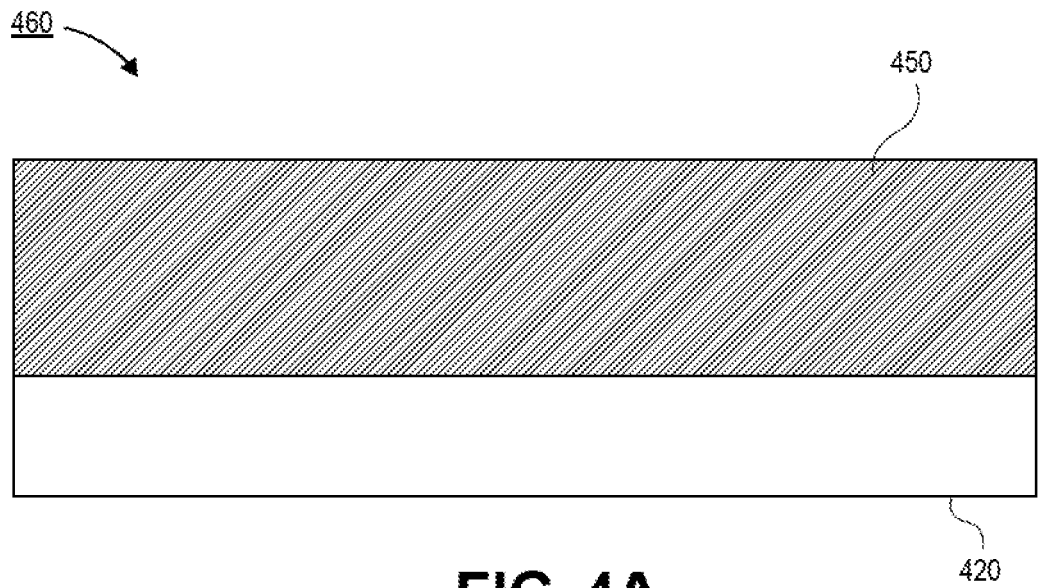
FIG. 4A is a cross-sectional illustration of a photoresist over a substrate, in accordance with an embodiment.

Referring now to FIG. 4A, a cross-sectional illustration of a workpiece 460 is shown, in accordance with an embodiment. In an embodiment, the workpiece 460 comprises a substrate 420 and a photoresist 450 over the substrate 420. The substrate 420 may be any suitable substrate. In an embodiment, the substrate 420 may comprise one or more organic layers and conductive features, such as traces, vias, and pads (not shown for simplicity). In an embodiment, the workpiece 460 may be a panel level workpiece, quarter panel level workpiece, or the like. That is, a plurality of devices may be fabricated in parallel and then subsequently singulated. In other embodiments, the workpiece 460 is already singulated, and only a single device is fabricated at a time.

In an embodiment, the photoresist 450 may be any suitable photoresist material. For example, the photoresist 450 may be a positive or negative resist. In an embodiment, the photoresist 450 may have a thickness of approximately 100 μm or greater, 200 μm or greater, or 300 μm or greater.

Figure 4B:
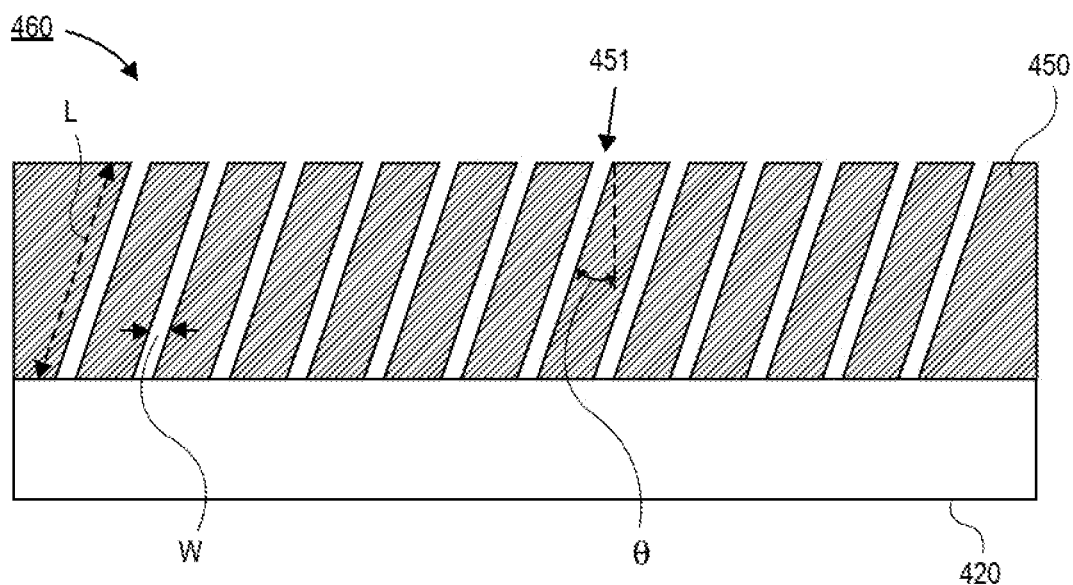
FIG. 4B is a cross-sectional illustration after openings are patterned into the photoresist with an angled patterning process, in accordance with an embodiment.

Referring now to FIG. 4B, a cross-sectional illustration of the workpiece 460 after openings 451 are patterned into the photoresist 450 is shown, in accordance with an embodiment. In an embodiment, the openings 451 may be oriented to the main surface of the substrate at a non-orthogonal angle $\theta$. In an embodiment, the angle $\theta$ may be between approximately 0° and approximately 45°. In an embodiment, the angle $\theta$ may be between approximately 15° and 30°. The openings 451 may pass entirely through a thickness of the photoresist 450. That is, a portion of the substrate 420 may be exposed by the openings 451. In an embodiment, the openings 451 may have a substantially uniform pitch. In an embodiment, there may be tens of openings 451, hundreds of openings 451, or thousands of openings 451, or tens of thousands of openings 451.

In an embodiment, the openings 451 may be patterned with an imaging system, such as those described above. For example, an imaging system with a Scheimpflug layout and a bi-telecentric lens may be used to expose the photoresist 450. Accordingly, high resolution and high aspect ratio openings 451 may be provided. For example, the openings 451 may have a width W between approximately 1 μm and 20 μm. Aspect ratios (i.e., length L:width W) of the openings 451 may be approximately 15:1 or greater, 30:1 or greater, or 50:1 or greater.

Figure 4C:
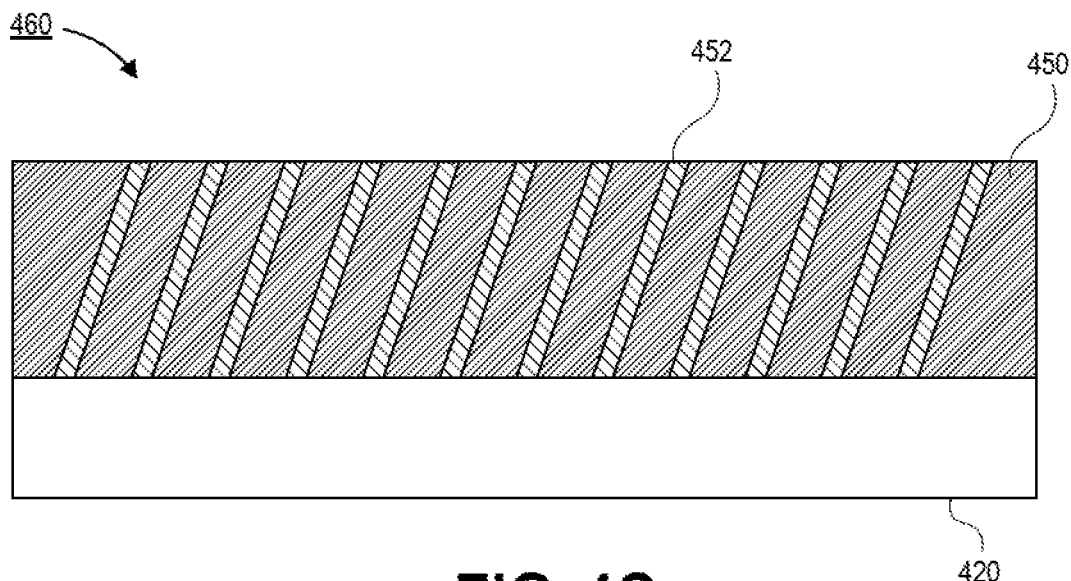
FIG. 4C is a cross-sectional illustration after pins are disposed in the openings, in accordance with an embodiment.

Referring now to FIG. 4C, a cross-sectional illustration of the workpiece 460 after the openings 451 are filled with pins 452 is shown, in accordance with an embodiment. In an embodiment, the openings 451 are filled with a conductive material. For example, the openings 451 may be filled with copper or the like in order to provide conductive pins 452. In an embodiment, the pins 452 may be deposited with any suitable deposition process, such as electroplating, electroless plating, physical vapor deposition (PVD), chemical vapor deposition (CVD), or the like.

Figure 4D:
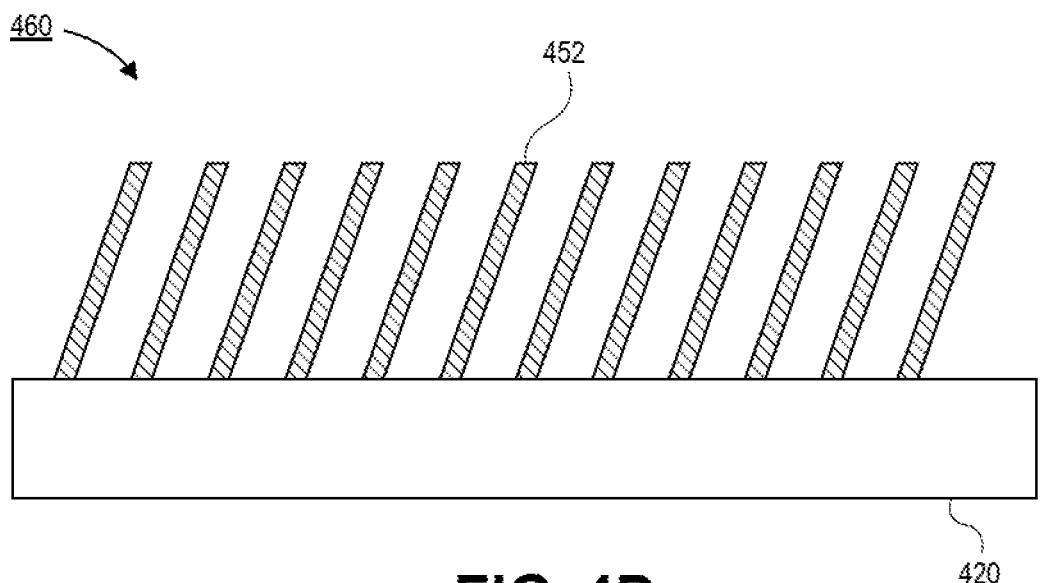
FIG. 4D is a cross-sectional illustration after the photoresist is removed in accordance with an embodiment.

Referring now to FIG. 4D, a cross-sectional illustration of the workpiece 460 after the photoresist 450 is removed is shown, in accordance with an embodiment. In an embodiment, the photoresist 450 may be removed with any suitable resist stripping process. Accordingly, the workpiece 460 includes a substrate 420 with a plurality of pins 452 extending up from the surface of the substrate at a non-orthogonal angle.

Figure 5A:
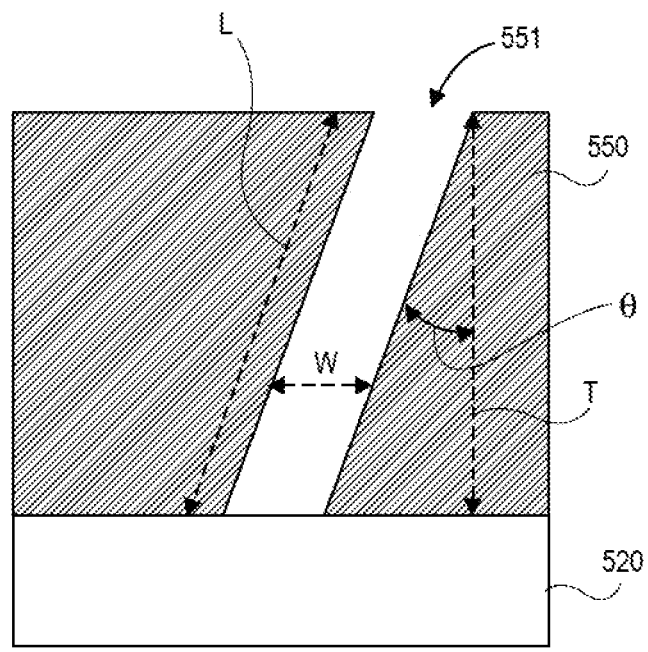
FIG. 5A is a cross-sectional illustration of an opening with a uniform width patterned into the photoresist, in accordance with an embodiment.
Figure 5B:
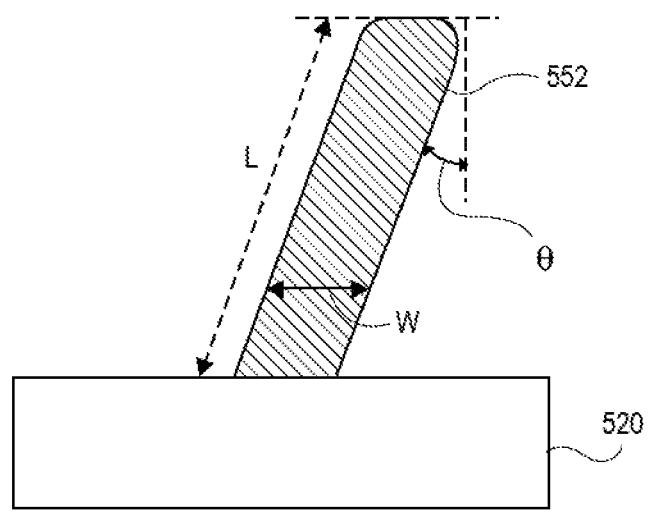
FIG. 5B is a cross-sectional illustration of a pin with a uniform width, in accordance with an embodiment.

Referring now to FIGS. 5A and 5B, a zoomed in cross-sectional illustration of one of the openings 551 and the resulting pin 552 are shown, respectively, in accordance with an embodiment. In an embodiment, the opening 551 through the resist 550 may have a substantially uniform width W along the entire length L of the opening 551. In an embodiment, the opening 551 passes entirely through a thickness T of the photoresist 550 to expose a portion of the substrate 520.

In an embodiment, the opening 551 may be oriented at a non-orthogonal angle $\theta$. For example, the angle $\theta$ may be between approximately 0° and approximately 45°. In an embodiment, the thickness T of the photoresist 550 may be between approximately 100 μm and 300 μm, or approximately 300 μm or greater. In an embodiment, an aspect ratio (i.e., L:W) of the opening 551 may be approximately 15:1 or greater, 30:1 or greater, or 50:1 or greater.

Referring now to FIG. 5B, a cross-sectional illustration after the opening 551 is filled with a pin 552 and the photoresist 550 is removed is shown, in accordance with an embodiment. As shown, the pin 552 is oriented at a non-orthogonal angle $\theta$ with respect to the surface of the substrate 520. The angle $\theta$ in FIG. 5B substantially matches the angle $\theta$ in FIG. 5A. Similarly, the width W of the pin 552 is substantially uniform over a length L of the pin 552.

Figure 6A:
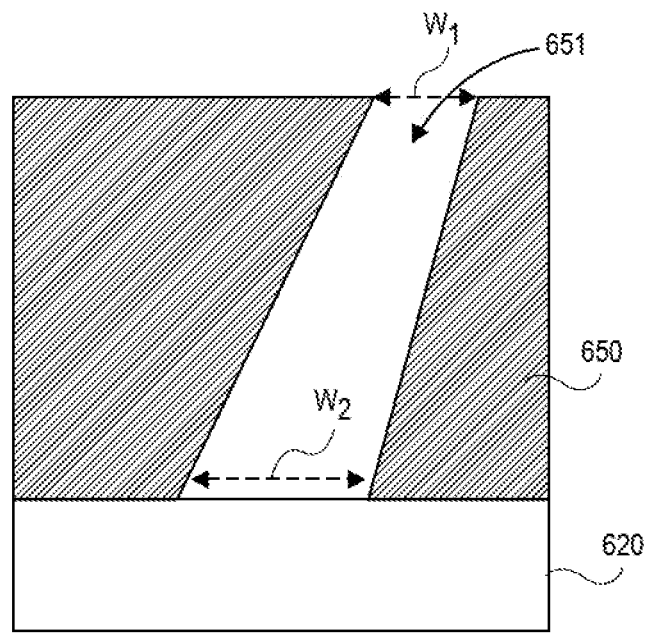
FIG. 6A is a cross-sectional illustration of an opening with a non-uniform width patterned into the photoresist, in accordance with an embodiment.
Figure 6B:
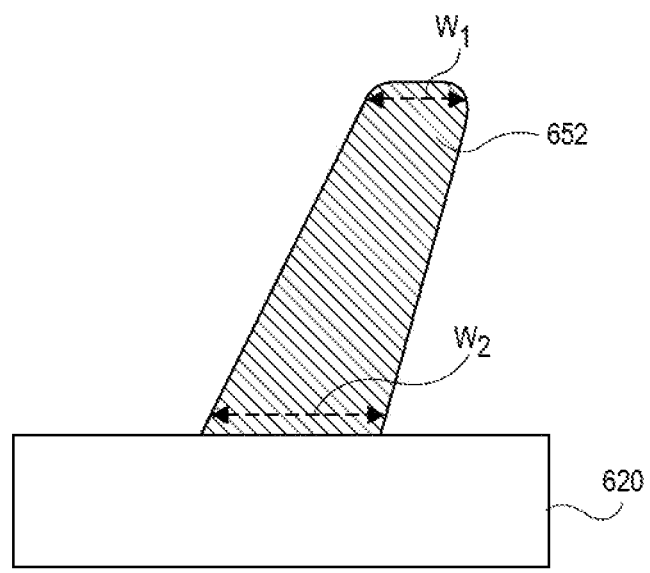
FIG. 6B is a cross-sectional illustration of a pin with a non-uniform width, in accordance with an embodiment.

Referring now to FIGS. 6A and 6B, a zoomed in cross-sectional illustration of one of the openings 651 and the resulting pin 652 are shown, respectively, in accordance with an embodiment. In an embodiment, the opening 651 passes through the photoresist 650 to expose a portion of the substrate 620. The opening 651 may be oriented at a non-orthogonal angle with respect to the substrate 620. In an embodiment, the opening 651 has a non-uniform width. For example, a first width W1 at the top of the opening 651 may be smaller than a second width W2 at the bottom of the opening 651.

Referring now to FIG. 6B, a cross-sectional illustration after the opening 651 is filled with a pin 652 and the photoresist 650 is removed is shown, in accordance with an embodiment. As shown, the tip of the pin 652 has a first width W1 that is smaller than a second width W2 of a base of the pin 652. For example, the second width W2 may be approximately 10 μm and the first width W2 may be less than approximately 10 μm. Such a configuration may be particularly useful for MEMS applications. For example, the thinner tip is more flexible and allows for larger tolerances while the thicker base of the pin 652 provides improved stiffness and mechanical reliability.

Figure 7:
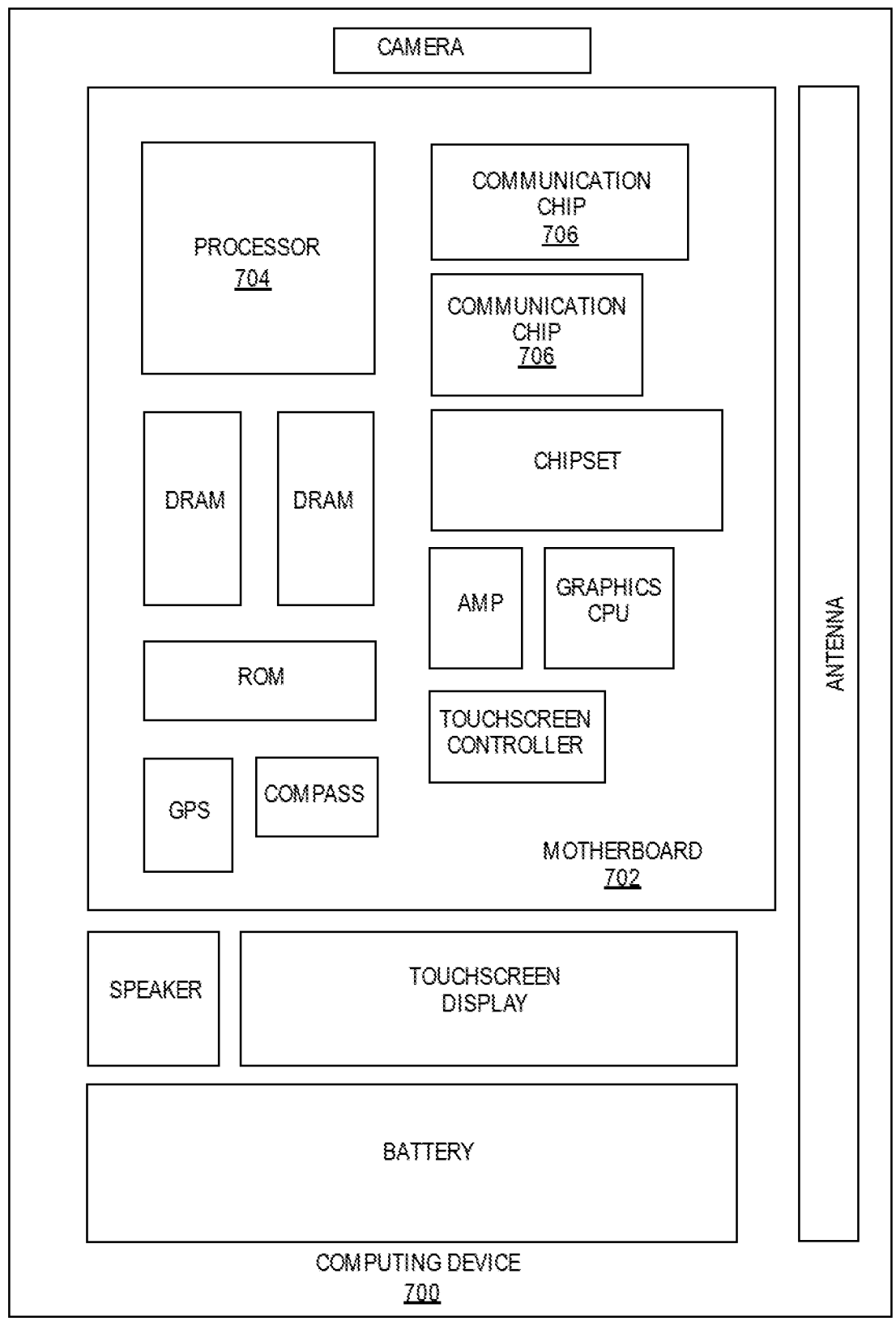
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor 704 may be part of an electronic package that comprises pins that extend out from the package substrate at a non-orthogonal angle, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip 706 may be part of an electronic package that comprises pins that extend out from the package substrate at a non-orthogonal angle, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a lithographic patterning system, comprising: an actinic radiation source, wherein the actinic radiation source is configured to propagate light along an optical axis; a mask mount, wherein the mask mount is configurable to orient a surface of a mask at a first angle with respect to the optical axis; a lens module; and a substrate mount, wherein the substrate mount is configurable to orient a surface of a substrate at a second angle with respect to the optical axis.

Example 2: the lithographic patterning system of Example 1, wherein the first angle is different than the second angle.

Example 3: the lithographic patterning system of Example 1 or Example 2, wherein the first angle and the second angle are supplementary angles.

Example 4: the lithographic patterning system of Examples 1-3, wherein the lens module is substantially orthogonal to the optical axis.

Example 5: the lithographic patterning system of Examples 1-4, wherein the lens module comprises a bi-telecentric lens.

Example 6: the lithographic patterning system of Examples 1-5, wherein the first angle is greater than 90°.

Example 7: the lithographic patterning system of Examples 1-6, further comprising: a lithographic mask mounted in the mask mount.

Example 8: the lithographic patterning system of Examples 1-7, further comprising: a substrate mounted in the substrate mount.

Example 9: the lithographic patterning system of Example 8, further comprising: a prism over the substrate.

Example 10: the lithographic patterning system of Example 9, further comprising: an index of reflection matching layer between the prism and the substrate.

Example 11: the lithographic patterning system of Examples 1-10, further comprising: an alignment camera.

Example 12: the lithographic patterning system of Example 11, wherein the alignment camera comprises an autocollimator and a distance detector.

Example 13: an electronic device, comprising: a substrate; and a plurality of pins extending out from the substrate, wherein the plurality of pins are oriented at a non-orthogonal angle with respect to the substrate.

Example 14: the electronic device of Example 13, wherein each pin has an aspect ratio of length to width of at least 15:1.

Example 15: the electronic device of Example 14, wherein the aspect ratio is at least 30:1.

Example 16: the electronic device of Examples 13-15, wherein a length of each pin is approximately 250 µm or greater.

Example 17: the electronic device of Examples 13-16, wherein a width of each pin is substantially uniform along a length of the pin.

Example 18: the electronic device of Examples 13-16, wherein a width of each pin is non-uniform along a length of the pin.

Example 19: the electronic device of Example 18, wherein a first width of the pin proximate to the substrate is greater than a second width of the pin distal from the substrate.

Example 20: the electronic device of Example 18 or Example 19, wherein the plurality of pins comprises over one hundred pins.

Example 21: the electronic device of Examples 13-20, wherein the non-orthogonal angle is between 0° and 45°.

Example 22: a method of patterning a layer with actinic radiation, comprising: securing a substrate with a photoimageable layer with a mount; and exposing the photoimageable layer with actinic radiation from a source, wherein the actinic radiation propagates along an optical axis that intersects a mask oriented at a first angle relative to the optical axis and a lens module, and wherein the photoimageable layer is oriented at a second angle relative to the optical axis.

Example 23: the method of Example 22, further comprising: aligning the substrate with a camera.

Example 24: the method of Example 23, wherein the camera is optically coupled to an autocollimator.

Example 25: the method of Examples 22-24, wherein the lens module comprises a bi-telecentric lens.

What is claimed is:

1. A lithographic patterning system, comprising:
an actinic radiation source, wherein the actinic radiation source is configured to propagate light along an optical axis;
a mask mount, wherein the mask mount is configurable to orient a surface of a mask at a first angle with respect to the optical axis;
a lens module; and
a substrate mount, wherein the substrate mount is configurable to orient a surface of a substrate at a second angle with respect to the optical axis, wherein the first angle is different than the second angle.

2. The lithographic patterning system of claim 1, wherein the first angle and the second angle are supplementary angles.

3. The lithographic patterning system of claim 1, wherein the lens module s substantially orthogonal to the optical axis.

4. The lithographic patterning system of claim 1, wherein the lens module comprises a bi-telecentric lens.

5. The lithographic patterning system of claim 1, wherein the first angle is greater than 90°.

6. The lithographic patterning system of claim 1, further comprising:
a lithographic mask mounted in the mask mount.

7. The lithographic patterning system of claim 1, further comprising:
a substrate mounted in the substrate mount.

8. The lithographic patterning system of claim 7, further comprising:
a prism over the substrate.

9. The lithographic patterning system of claim 8, further comprising:
an index of reflection matching layer between the prism and the substrate.

10. The lithographic patterning system of claim 1, further comprising:
an alignment camera.

11. The lithographic patterning system of claim 10, wherein the alignment camera comprises an autocollimator and a distance detector.

12. A method of patterning a layer with radiation, comprising:
securing a substrate with a photoimageable layer with a mount; and
exposing the photoimageable layer with actinic radiation from a source, wherein the actinic radiation propagates along an optical axis that intersects a mask oriented at a first a relative to the optical axis and a lens module, wherein the photoimageable layer is oriented at a second angle relative to the optical axis, and wherein the first angle is different than the second angle.

13. The method of claim 12, further comprising:
aligning the substrate with a camera.

14. The method of claim 13, wherein the camera is optically coupled to an autocollimator.

15. The method of claim 12, wherein the lens module comprises a bi-telecentric lens.

16. A lithographic patterning system, comprising:
an actinic radiation source, wherein the actinic radiation source is configured to propagate light along an optical axis;
a mask mount, wherein the mask mount is configurable to orient a surface of a mask at a first angle with respect to the optical axis;
a lens module;
a substrate mount, wherein the substrate mount is configurable to orient a surface of a substrate at a second angle with respect to the optical axis;
a substrate mounted in the substrate mount;
a prism over the substrate; and
an index of reflection matching layer between the prism and e substrate.

17. A lithographic patterning system, comprising:
an actinic radiation source, wherein the actinic radiation source is configured to propagate light along an optical axis;
a mask mount, wherein the mask mount is configurable to orient a surface of a mask at a first angle with respect to the optical axis;
a lens module;
a substrate mount, wherein the substrate mount is configurable to orient a surface of a substrate at a second angle with respect to the optical axis; and
an aligns ent camera, wherein the alignment camera comprises an autocollimator and a distance detector.

* * * * *